United States Patent
Pritchard et al.

(10) Patent No.: US 7,705,246 B1
(45) Date of Patent: Apr. 27, 2010

(54) COMPACT DIFFERENTIAL SIGNAL VIA STRUCTURE

(75) Inventors: Jason Pritchard, Hopkinton, MA (US); Michael Gnieski, Shrewsbury, MA (US)

(73) Assignee: EMC Corporation, Hopkinton, MA (US)

( * ) Notice: Subject to any disclaimer, the term of this patent is extended or adjusted under 35 U.S.C. 154(b) by 166 days.

(21) Appl. No.: 11/965,811

(22) Filed: Dec. 28, 2007

(51) Int. Cl.
*H01R 12/04* (2006.01)
*H05K 1/11* (2006.01)

(52) U.S. Cl. ........................................ 174/262; 361/792
(58) Field of Classification Search ......... 174/262–266; 361/792–795
See application file for complete search history.

(56) References Cited

U.S. PATENT DOCUMENTS

| | | | | |
|---|---|---|---|---|
| 4,636,919 A | * | 1/1987 | Itakura et al. | 361/794 |
| 6,891,272 B1 | * | 5/2005 | Fjelstad et al. | 257/774 |
| 7,448,909 B2 | * | 11/2008 | Regnier et al. | 439/607.05 |
| 2006/0266549 A1 | * | 11/2006 | Lin et al. | 174/262 |

* cited by examiner

*Primary Examiner*—Jeremy C Norris

(57) ABSTRACT

A differential signal via structure for a printed circuit board having a pair of signal vias extending vertically from a surface of the board to an interior region of the board to contact signal conductors disposed horizontally within the interior region of the board and a pair of ground vias extending vertically from a surface of the circuit board to an interior region of the board to contact ground conductors disposed horizontally within the interior region of the board.

14 Claims, 9 Drawing Sheets

COMPACT DIFFERENTIAL SIGNAL VIA STRUCTURE

TECHNICAL FIELD

This invention relates generally to differentials signal via structures and more particularly to high-performance, high-density differential signal via structures in printed circuit boards (PCBs).

BACKGROUND

As is known in the art, a typical differential signal via structure used in a PCB is shown in FIGS. 1, 2 and 3; it is noted that in FIG. 1, the solid dielectric used in the antipad is not shown to see the inner region of the via structure. The structure is used to couple differential signals fed to, or coupled from the PCB and transmission lines within the PCB. The vias structure includes a pair of vertically extending signal vias separated from each other and from ground plane conductors by dielectric material of the PCB. The vertically extending signal vias connect to signal conductors disposed within the PCB and the ground vias connect to the ground plane conductors within the PCB and to ground plane conductors on the outer surfaces of the PCB. There are a pair of ground plane conductors in the PCB for each signal conductor within the PCB, each signal conductor having a ground plane above it and one below it to thereby form a transmission line within the PCB. Also, as shown more clearly in FIG. 2, the pair of signal vias is dielectrically separated from the ground vias by an oval shaped, vertically extending void formed in the PCB, such void sometimes being referred to as an anti-pad.

Referring to FIG. 2, it is noted that the pair of signal conductors and the pair of ground plane conductors are disposed in a common, vertically extending plane perpendicular to the planar surface of the PCB. It is also noted that the signal vias are aligned in the same plane as the ground vias.

It would be desirable to provide a smaller via structure having improved signal impedance matching and electromagnetic field characteristics between differential signals fed to, or coupled from the PCB and the transmission lines within the PCB.

SUMMARY

In accordance with the invention, a differential signal via structure for a printed circuit board is provided. The structure includes: a pair of signal vias disposed in a common signal via plane extending vertically from a surface of the printed circuit board to an interior region of the printed circuit board to contact signal conductors disposed horizontally within the interior region of the printed circuit board; and a pair of ground vias disposed in a common via plane extending vertically from a surface of the printed circuit board to an interior region of the printed circuit board to contact ground conductors disposed horizontally within the interior region of the printed circuit board. The signal via plane intersects the ground via plane.

In one embodiment, the signal via plane is substantially perpendicular to the ground via plane.

In one embodiment, the signal vias are disposed in an anti-pad void passing vertically through the printed circuit board and wherein the pair of ground vias is disposed outside of the anti-pad void.

In one embodiment, the signal vias are disposed in an anti-pad void passing vertically through the printed circuit board and wherein the pair of ground vias is disposed outside of the anti-pad void.

In accordance with still another embodiment, a differential signal via structure for a printed circuit board is provided having: a pair of signal vias extending vertically from a surface of the printed circuit board to an interior region of the printed circuit board to contact signal conductors disposed horizontally within the interior region of the printed circuit board; and a pair of ground vias extending vertically from a surface of the printed circuit board to an interior region of the printed circuit board to contact ground conductors disposed horizontally within the interior region of the printed circuit board. At the surface of the printed circuit board, the ground vias are disposed in an outer region of the via structure and the signal vias are disposed in an inner region of the via structure.

In one embodiment, at the surface of the printed circuit board, the distances from each one of the signal vias to each one of the pair of ground vias are substantially equal.

In one embodiment, the pair of signal vias are disposed in a common signal via plane extending vertically from a surface of the printed circuit board to an interior region of the printed circuit board, the pair of ground vias are disposed in a common signal via plane extending vertically from a surface of the printed circuit board to an interior region of the printed circuit board, and wherein the signal via plane intersects the ground via plane.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
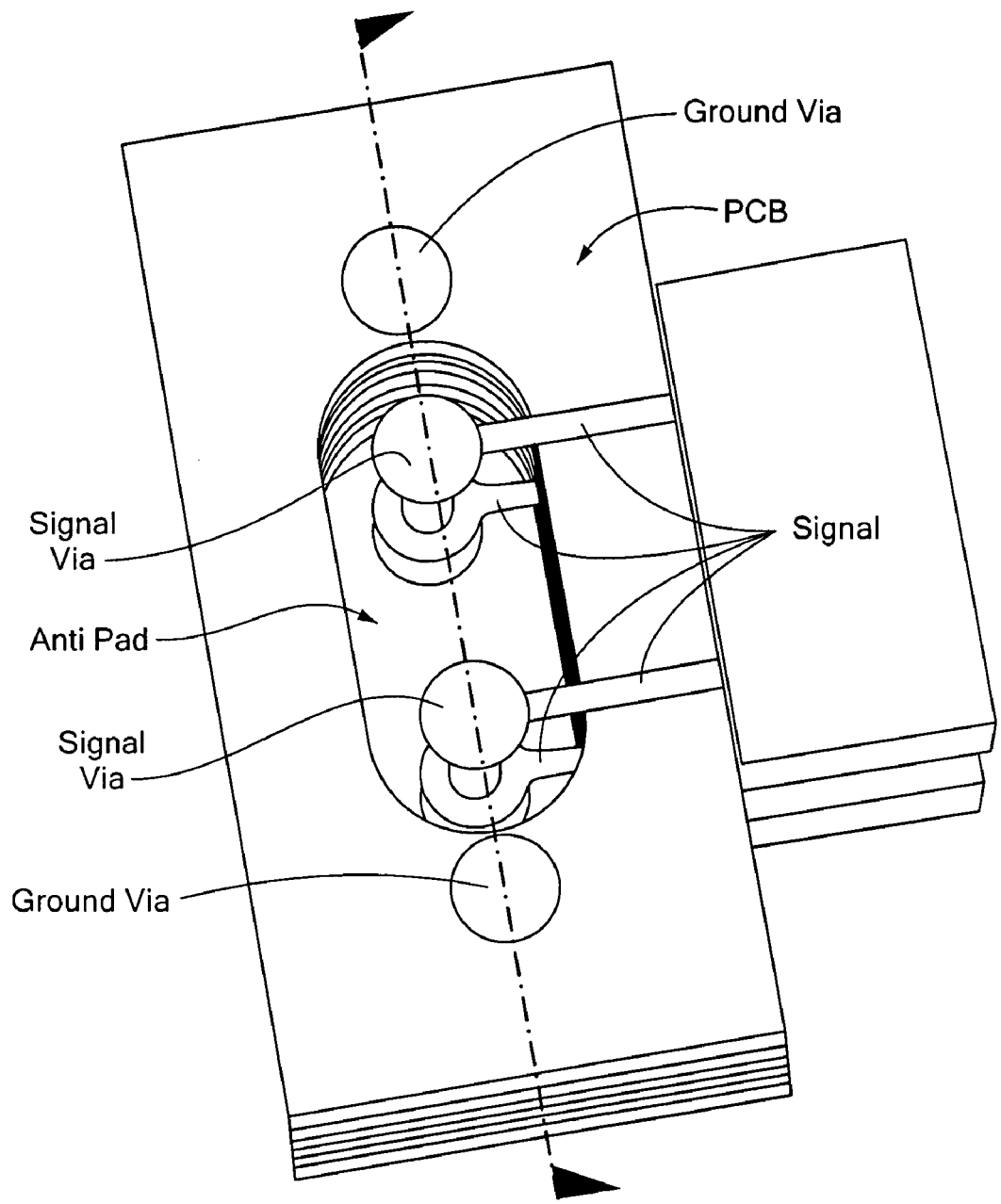
FIG. 1 is a perspective sketch of a via structure according to the PRIOR ART.
Figure 2:
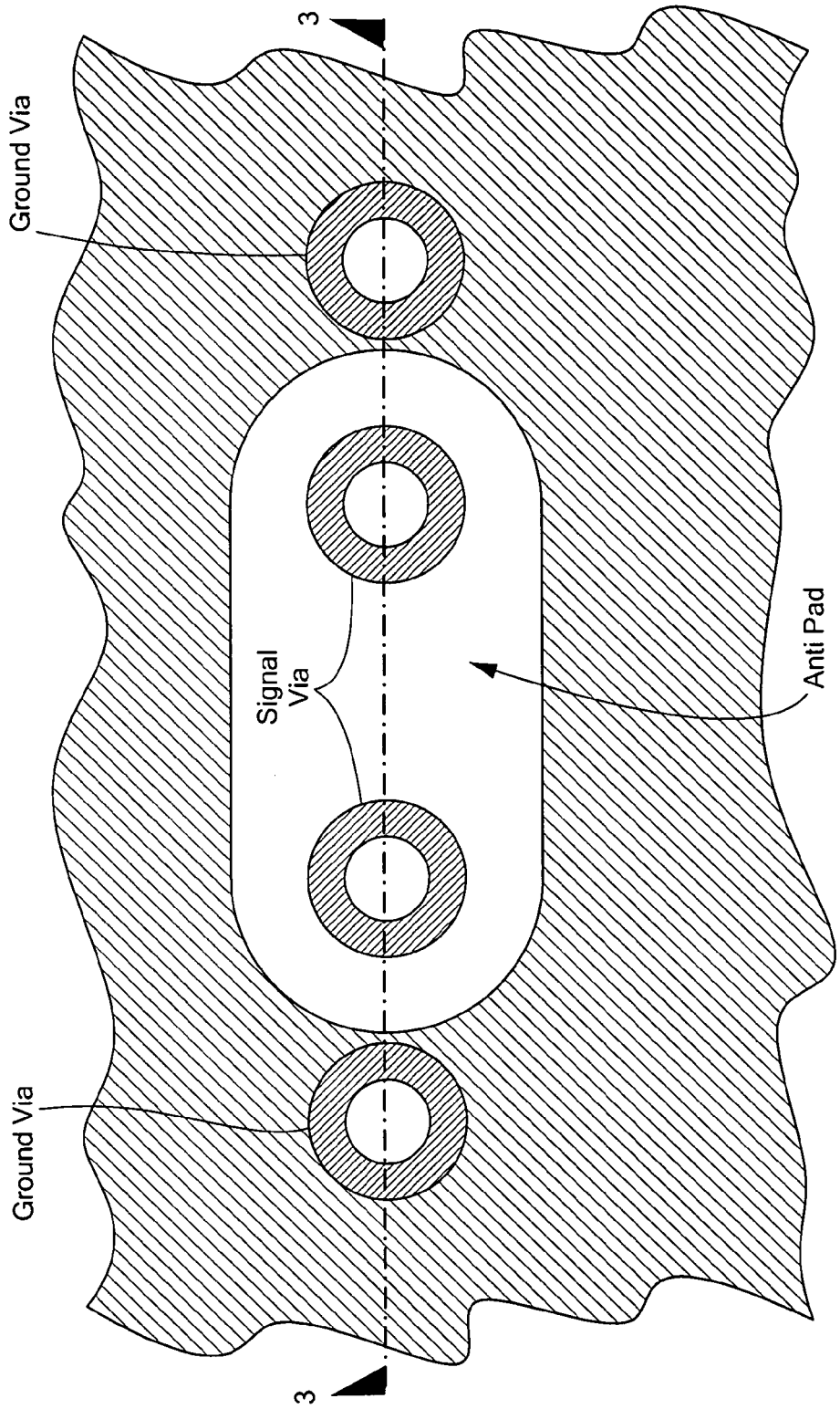
FIG. 2 is a top cross sectional view of the via structure according to the PRIOR ART, such cross section being taken along line 2-2 in FIG. 3.
Figure 3:
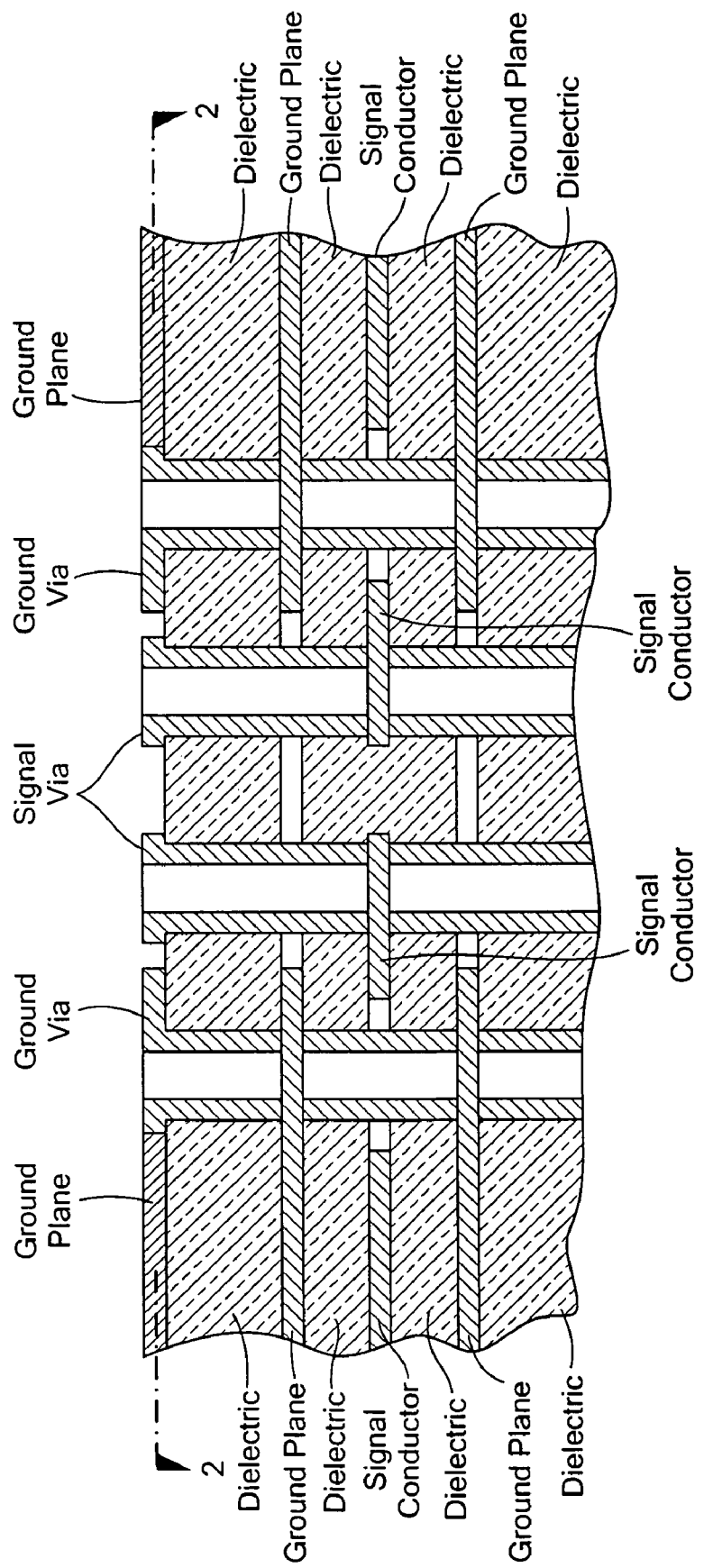
FIG. 3 is a side cross sectional view of the via structure according to the PRIOR ART, such cross section being taken along line 3-3 in FIG. 2.
Figure 4:
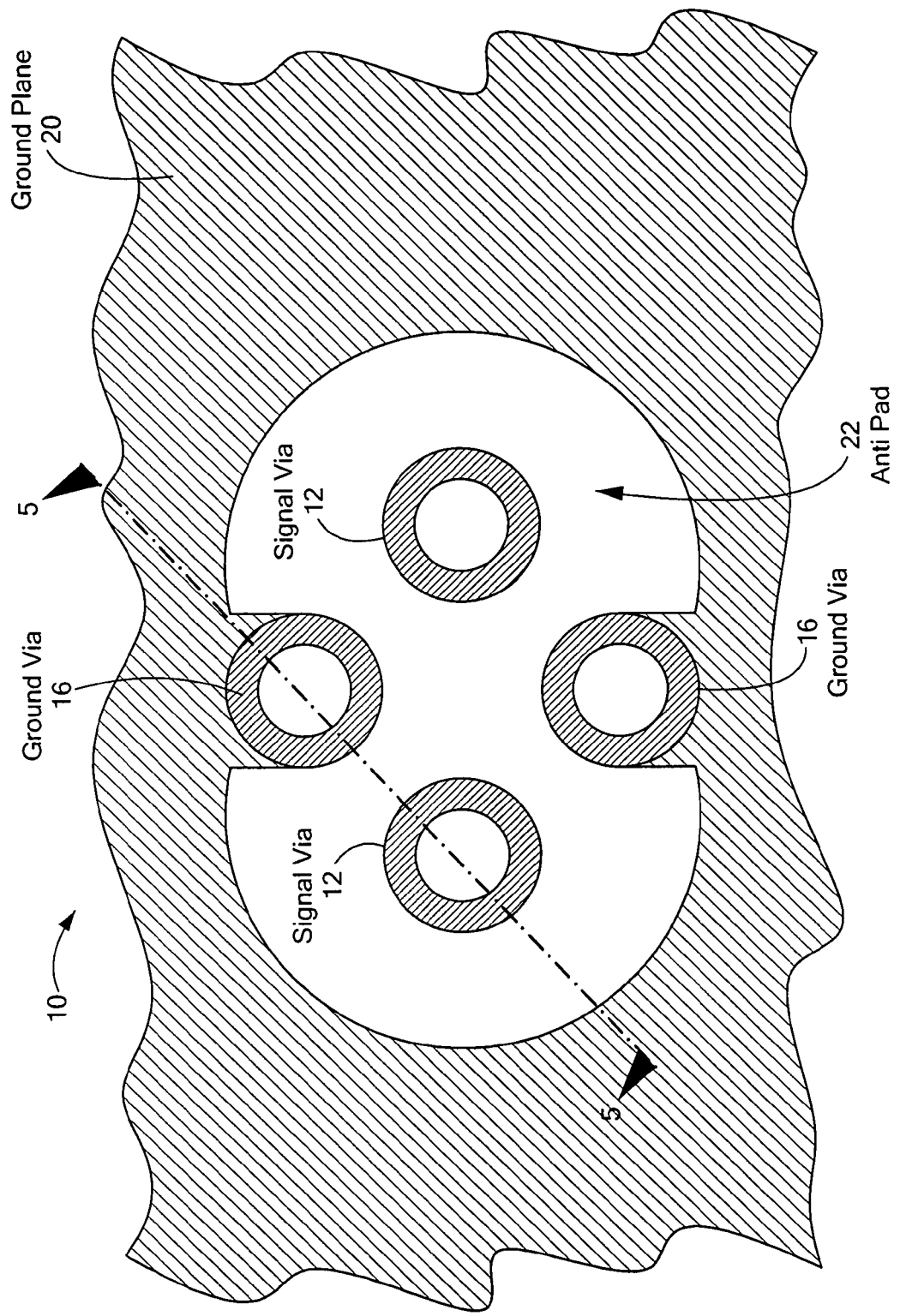
FIG. 4 is a top cross sectional view of the via structure according to the invention, such cross section being taken along line 4-4 in FIG. 5.
Figure 5:
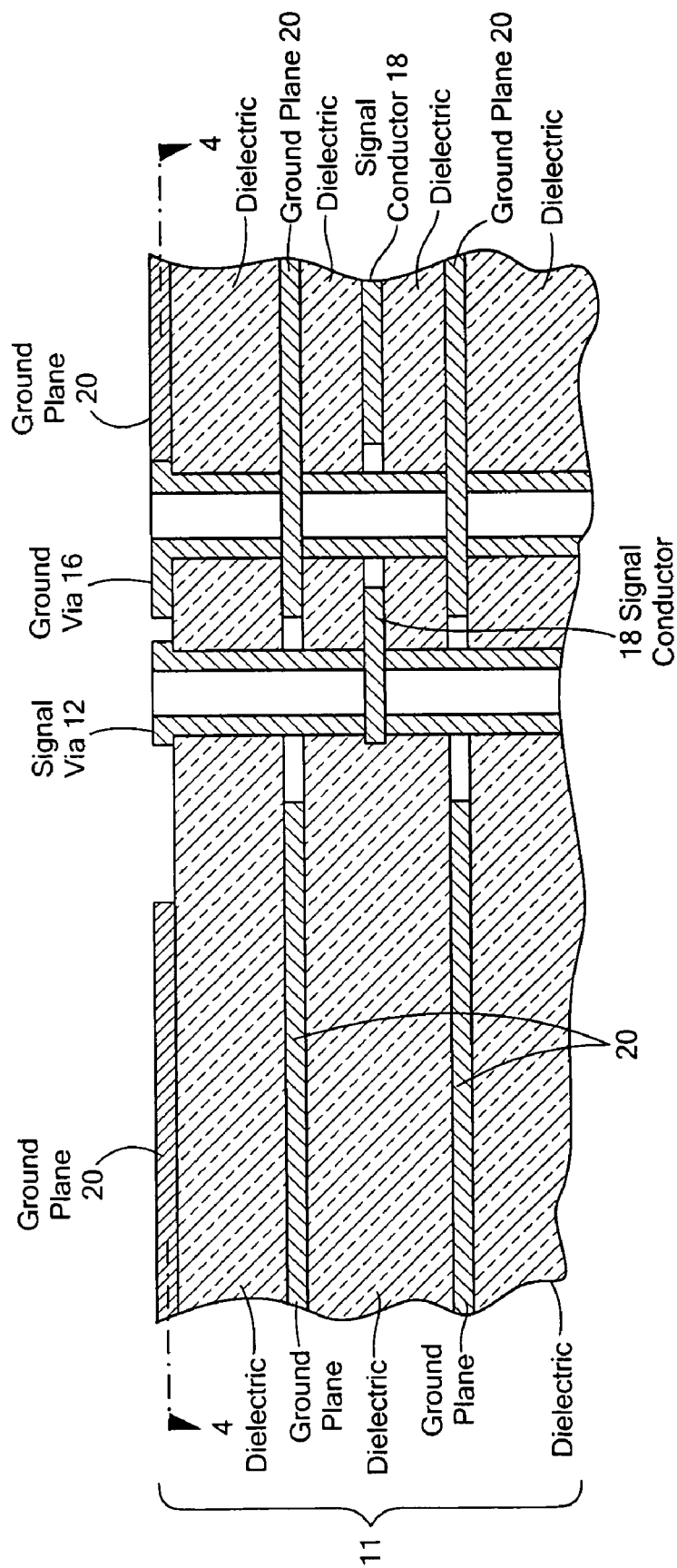
FIG. 5 is a side cross sectional view of the via structure according to the PRIOR ART, such cross section being taken along line 5-5 in FIG. 4.
Figure 7:
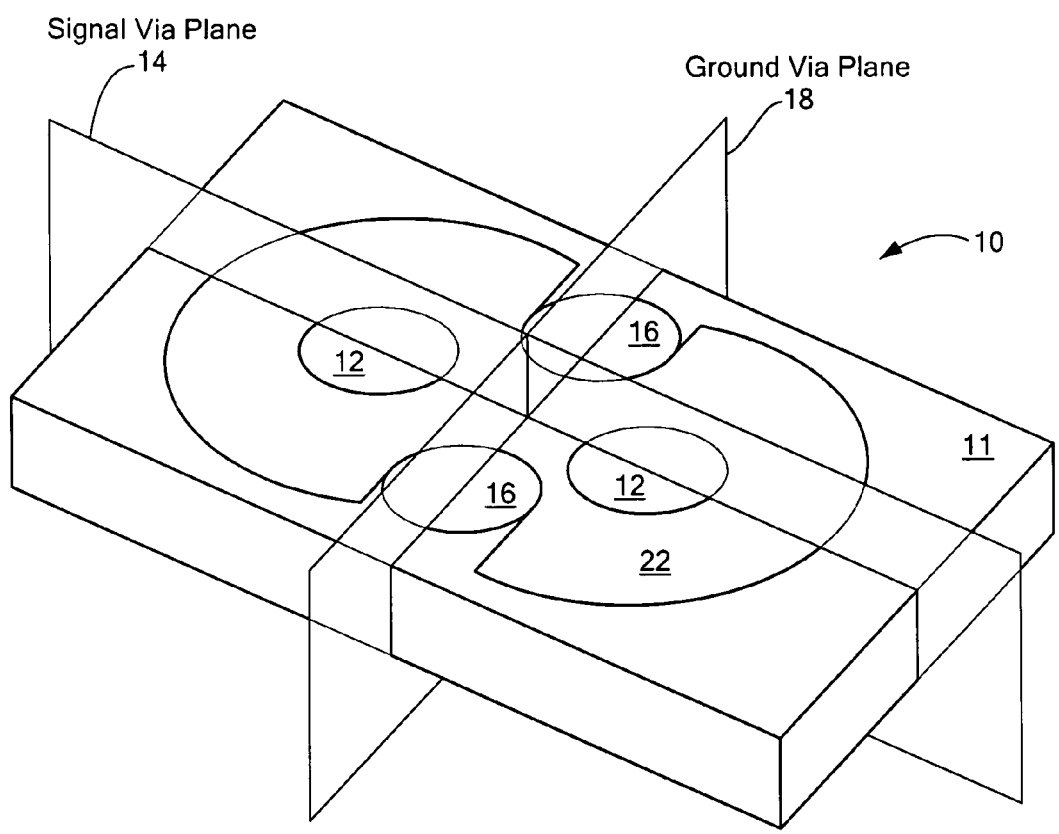
FIG. 7 is a prospective sketch of a via structure according to the invention showing a pair planes passing through the via structure, one plane having disposed therein a pair of ground vias and the other plane having disposed therein a pair of signal vias, such planes being perpendiculars to each other.

Referring now to FIGS. 4 and 5, a differential signal via structure 10 for a printed circuit board 11 is shown. The structure 10 includes: (1) a pair of signal vias 12 disposed in a common signal via plane 14 (FIG. 7) extending vertically from a surface of the printed circuit board 11 to an interior region of the printed circuit board 11 to contact signal conductors 18 (FIG. 5) disposed horizontally within the interior region of the printed circuit board 11; and (2) a pair of ground vias 16 disposed in a common via plane 14 (FIG. 7) extending vertically from a surface of the printed circuit board 11 to an interior region of the printed circuit board to contact ground conductors 20 disposed horizontally within the interior region of the printed circuit board and on the surface of the printed circuit board 11. The signal via plane 14 intersects the ground via plane 16 (FIG. 7). Here, the signal via plane 14 is substantially perpendicular to the ground via plane 16. The signal vias 12 are disposed in an anti-pad void 22 passing vertically through the printed circuit board 11 and the pair of ground vias 16 are disposed outside of the anti-pad void 22.

The signal vias 12 are disposed in an anti-pad void 22 passing vertically through the printed circuit board 11 and the pair of ground vias 16 are disposed outside of the anti-pad void 22. At the surface of the printed circuit board 11, the ground vias 16 are disposed in an outer region of the via structure 10 and the signal vias 12 are disposed in an inner region of the via structure 10.

Figure 6A:
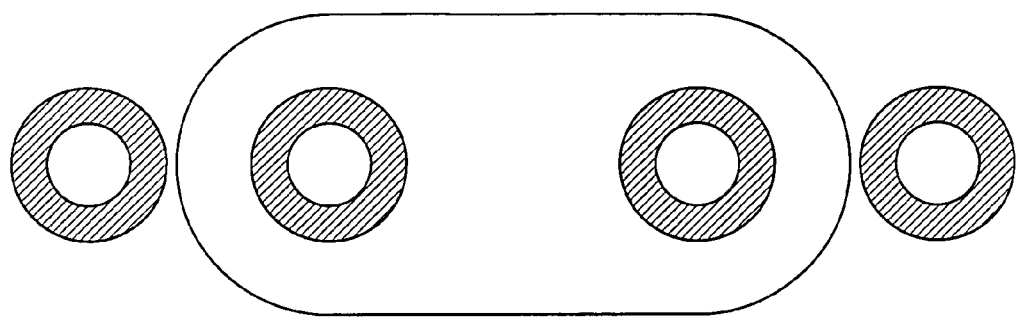
FIGS. 6A and 6B are plan views of the via structure according to the PRIOR ART and according to the invention, respectively, showing a comparison of the foot prints of such via structures.
Figure 6B:
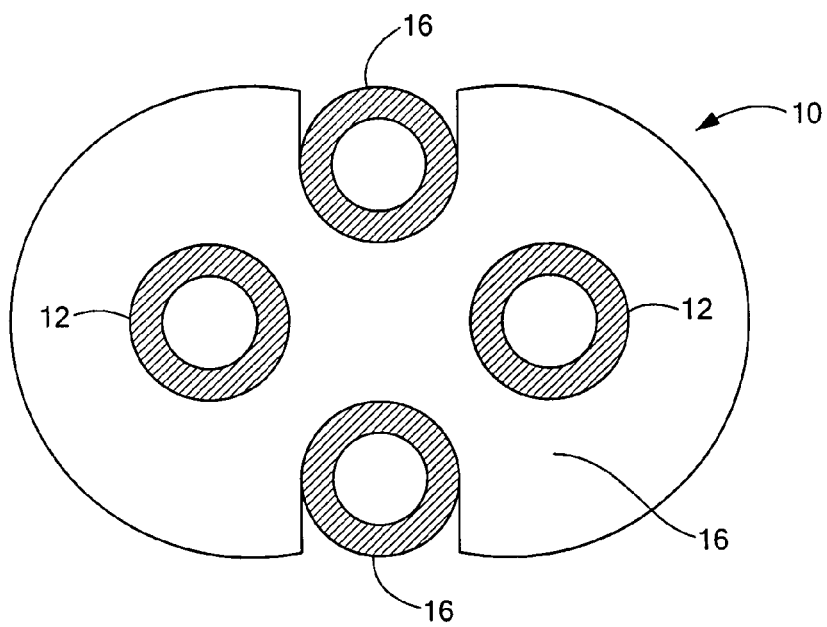

Referring now to FIGS. 6A and 6B, a compassion between the PRIOR ART via structure and the via structure 10 of FIG. 4 are shown, respectively, it being noted that the footprint of the former, PRIOR ART via structure is greater than the foot print of the vias structure according to the invention.

Figure 8A:
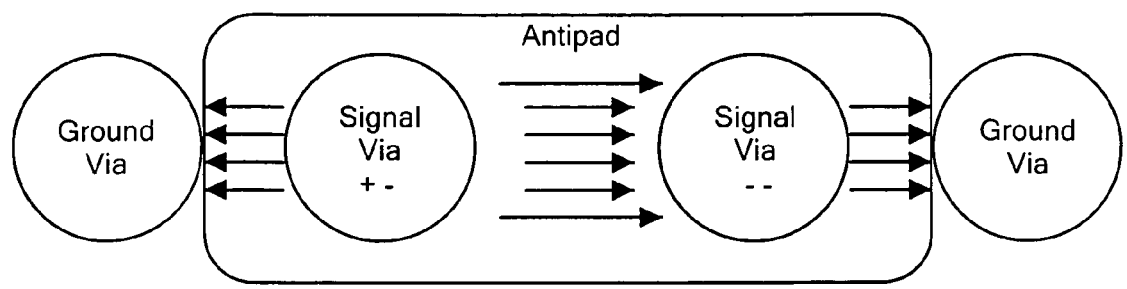
FIG. 8A is a plan view sketch of the via structure according to the prior art, such sketch showing the electric fields between the ground and signal vias therein.
Figure 8B:
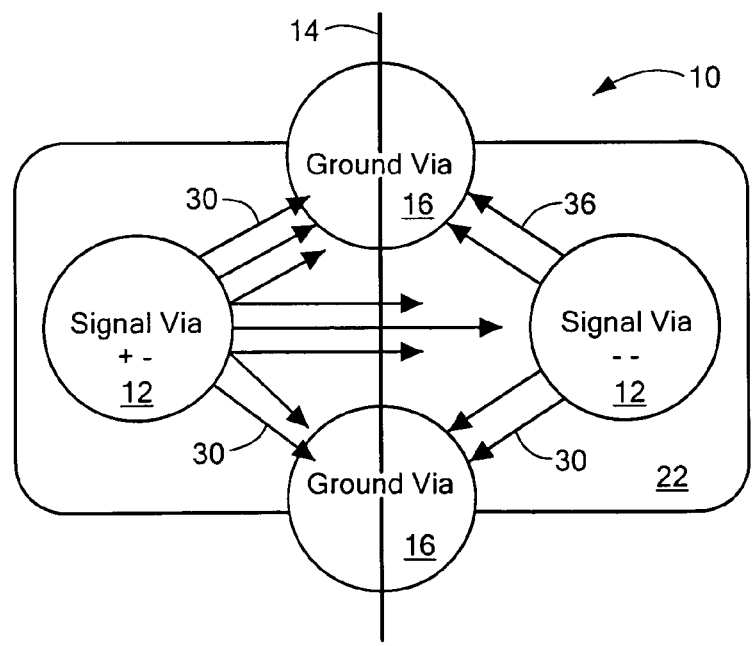
FIG. 8B is a plan view sketch of the via structure according to the invention, such sketch showing the electric fields between the ground and signal vias therein.

Referring to FIGS. 8A and 8B, FIG. 8A shown the electric fields with the via structure of the PRIOR ART and FIG. 8B shows the electri8c fields 30 with the via structure 10 of FIG. 4. It is noted that the electromagnetic fields of a differential via are between the positive and the negative leg of the differential signal pair of vias as well as the ground vias. By placing the ground vias 16 at the locations shown in FIG. 8B, one allowed to create a controlled impedance via that has all of the electromagnetic fields directed to the center versus many different directions as the PRIOR ART, FIG. 8A. This allows one to optimize the location of the signal vias 12 in the signal via anti-pad 22 and minimizing space.

At the surface of the printed circuit board, the distances from each one of the signal vias 12 to each one of the pair of ground vias 16 are substantially equal.

It is noted that by placing the ground vias 22 on a plane 14 in the middle of the signal vias 12, such an arrangement forces a majority of the electromagnetic fields to the center of the structure 10. Forcing the electromagnetic fields to the center of the signal vias 12 allows better utilization of space in the anti-pad. Signal vias can then be offset closer to the outer edges of the anti-pad to maximize space and improve electrical characteristics.

Figure 9:
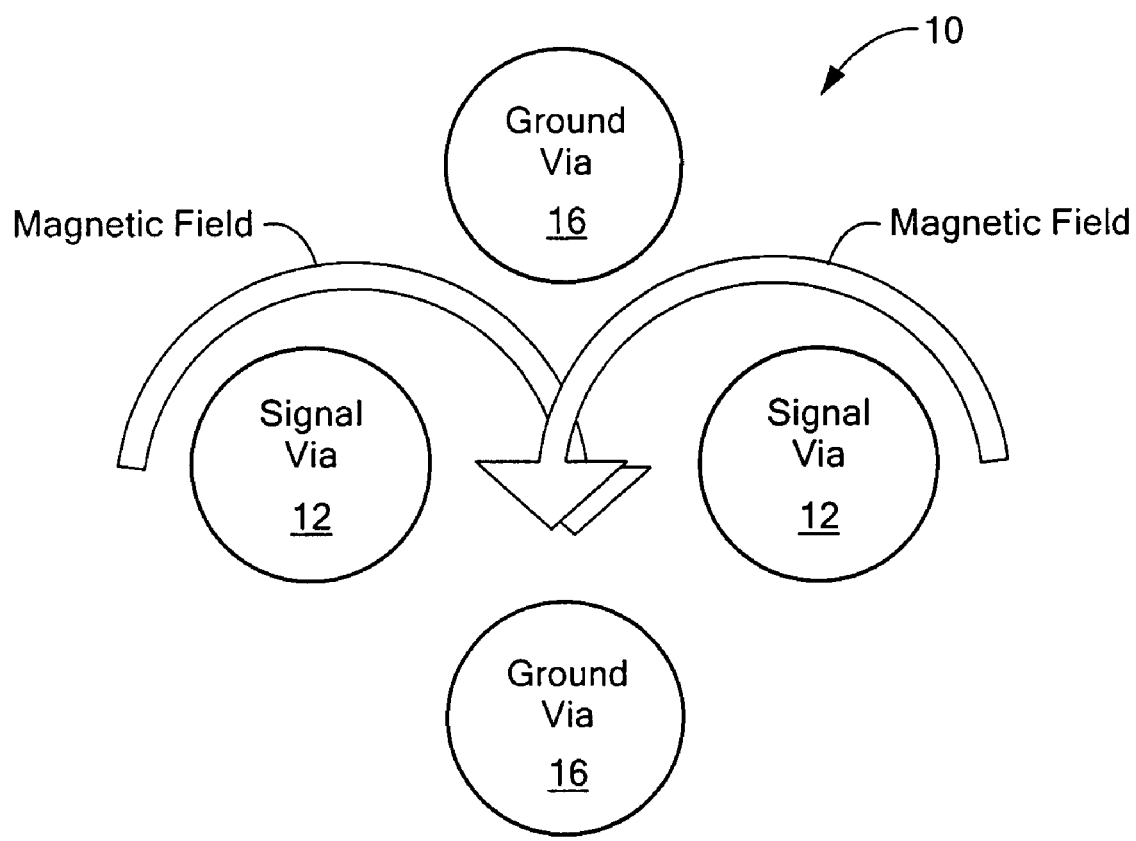
FIG. 9 is a plan view sketch of the via structure according to the invention, such sketch showing the magnetic fields around the signal vias therein.

To enter or exit the differential via the differential signal must go around one of the ground vias. Any common mode currents related to the differential signal have a direct path to ground before the signal enters the via. The magnetic coupling to the planes or nearby vias is reduced by the ground via placement, as shown in FIG. 9.

A number of embodiments of the invention have been described. Nevertheless, it will be understood that various modifications may be made without departing from the spirit and scope of the invention. Accordingly, other embodiments are within the scope of the following claims.

What is claimed is:

1. A differential signal via structure for a printed circuit board, comprising:

a pair of signal vias disposed in a common signal via plane extending vertically from a surface of the printed circuit board to an interior region of the printed circuit board to contact signal conductors disposed horizontally within the interior region of the printed circuit board;

a pair of ground vias disposed in a common via plane extending vertically from a surface of the printed circuit board to an interior region of the printed circuit board to contact ground conductors disposed horizontally within the interior region of the printed circuit board;

wherein the signal via plane intersects the ground via plane; and wherein at the surface of the printed circuit board, the distance from a first one of the pair of signal vias to a first one of the pair of ground vias is equal to the distance from said first one of the pair of signal vias to a second one of the pair of ground vias.

2. The via structure recited in claim 1 wherein the signal via plane is substantially perpendicular to the ground via plane.

3. The via structure recited in claim 1 wherein the signal vias are disposed in an anti-pad void passing vertically through the printed circuit board and wherein the pair of ground vias are disposed outside of the anti-pad void.

4. The via structure recited in claim 3 wherein the signal via plane is substantially perpendicular to the ground via plane.

5. The via structure recited in claim 1 wherein at the surface of the printed circuit board, wherein at the surface of the printed circuit board, the distance from a second one of the pair of signal vias to the first one of the pair of ground vias is equal to the distance from said second one of the pair of signal vias to the second one of the pair of ground vias.

6. A differential signal via structure for a printed circuit board, comprising:

a pair of signal vias extending vertically from a surface of the printed circuit board to an interior region of the printed circuit board to contact signal conductors disposed horizontally within the interior region of the printed circuit board;

a pair of ground vias extending vertically from a surface of the printed circuit board to an interior region of the printed circuit board to contact ground conductors disposed horizontally within the interior region of the printed circuit board; and wherein at the surface of the printed circuit board, the distance from a first one of the pair of signal vias to a first one of the pair of ground vias is equal to the distance from said first one of the pair of signal vias to a second one of the pair of ground vias.

7. The via structure recited in claim 6 wherein the signal vias are disposed in an anti-pad void passing vertically through the printed circuit board and wherein the pair of ground vias are disposed outside of the anti-pad void.

8. The via structure recited in claim 6 wherein at the surface of the printed circuit board, wherein at the surface of the printed circuit board, the distance from a second one of the pair of signal vias to the first one of the pair of ground vias is equal to the distance from said second one of the pair of signal vias to the second one of the pair of ground vias.

9. A differential signal via structure for a printed circuit board, comprising:
- a pair of signal vias extending vertically from a surface of the printed circuit board to an interior region of the printed circuit board to contact signal conductors disposed horizontally within the interior region of the printed circuit board;
- a pair of ground vias extending vertically from a surface of the printed circuit board to an interior region of the printed circuit board to contact ground conductors disposed horizontally within the interior region of the printed circuit board; and
- wherein at the surface of the printed circuit board, the ground vias are disposed in an outer region of the via structure and the signal vias are disposed in an inner region of the via structure; and
- wherein at the surface of the printed circuit board, the distance from a first one of the pair of signal vias to a first one of the pair of ground vias is equal to the distance from said first one of the pair of signal vias to a second one of the pair of ground vias.

10. The via structure recited in claim 9 wherein at the surface of the printed circuit board, the distance from a second one of the pair of signal vias to the first one of the pair of ground vias is equal to the distance from said second one of the pair of signal vias to the second one of the pair of ground vias.

11. The via structure recited in claim 10 wherein the pair of signal vias are disposed in a common signal via plane extending vertically from a surface of the printed circuit board to an interior region of the printed circuit board, the pair of ground vias are disposed in a common signal via plane extending vertically from a surface of the printed circuit board to an interior region of the printed circuit board, and wherein the signal via plane intersects the ground via plane.

12. The via structure recited in claim 11 wherein the signal via plane is substantially perpendicular to the ground via plane.

13. The via structure recited in claim 12 wherein at the surface of the printed circuit board, the distances from each one of the signal vias to each one of the pair of ground vias are substantially equal.

14. The via structure recited in claim 9 wherein at the surface of the printed circuit board, wherein at the surface of the printed circuit board, the distance from a second one of the pair of signal vias to the first one of the pair of ground vias is equal to the distance from said second one of the pair of signal vias to the second one of the pair of ground vias.

* * * * *